United States Patent
Lee et al.

(10) Patent No.: US 9,056,331 B2
(45) Date of Patent: Jun. 16, 2015

(54) THIN LAYER HAVING COMPOSITION GRADIENT AND PRODUCTION METHOD THEREOF

(75) Inventors: Kwang Hee Lee, Suwon-si (KR); Xavier Bulliard, Yongin-si (KR); Jong Jin Park, Yongin-si (KR); Yun Hyuk Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 845 days.

(21) Appl. No.: 12/350,620

(22) Filed: Jan. 8, 2009

(65) Prior Publication Data

US 2010/0021691 A1    Jan. 28, 2010

(30) Foreign Application Priority Data

Jul. 23, 2008    (KR) .................. 10-2008-0071730

(51) Int. Cl.
| | |
|---|---|
| B32B 3/00 | (2006.01) |
| B32B 9/00 | (2006.01) |
| B05D 7/00 | (2006.01) |
| C23C 14/34 | (2006.01) |
| B05D 7/04 | (2006.01) |
| B05D 5/08 | (2006.01) |
| C23C 14/02 | (2006.01) |
| C23C 14/08 | (2006.01) |
| C23C 14/10 | (2006.01) |
| B05D 3/02 | (2006.01) |

(52) U.S. Cl.
CPC .............. B05D 7/04 (2013.01); B05D 3/0254 (2013.01); B05D 5/083 (2013.01); C23C 14/024 (2013.01); C23C 14/081 (2013.01); C23C 14/10 (2013.01)

(58) Field of Classification Search
USPC ............ 428/172, 446; 427/402, 419.5, 419.7, 427/419.8; 204/192.1; 106/287.11, 287.12
See application file for complete search history.

(56) References Cited

U.S. PATENT DOCUMENTS

| | | | | |
|---|---|---|---|---|
| 5,266,222 A | * | 11/1993 | Willis et al. ................. | 508/206 |
| 5,580,819 A | * | 12/1996 | Li et al. ...................... | 427/167 |
| 5,589,252 A | * | 12/1996 | Matsuo et al. ............... | 428/216 |
| 6,395,341 B1 | * | 5/2002 | Arakawa et al. .......... | 427/419.1 |
| 6,503,634 B1 | | 1/2003 | Utz et al. | |
| 6,639,039 B1 | * | 10/2003 | Fries et al. ................... | 528/32 |

(Continued)

FOREIGN PATENT DOCUMENTS

| | | | |
|---|---|---|---|
| EP | 1835002 | | 9/2007 |
| JP | 09202652 A | * | 8/1997 |

(Continued)

OTHER PUBLICATIONS

Machine English Translation of JP_09-202652, Kinoshita, Production of Refractive Distribution Type Optical Element, Aug. 5, 1997, Abstract.*

(Continued)

*Primary Examiner* — Tahseen N Khan
(74) *Attorney, Agent, or Firm* — Cantor Colburn LLP

(57) ABSTRACT

Disclosed herein are a thin layer having a composition gradient and a method for the production of the thin layer. According to the method, the thin layer is produced by subjecting a mixture of one or more organic materials and one or more inorganic materials to a sol-gel process. The composition gradient and the surface energy of the thin layer are controlled during production, leaving no interfacial failure defects.

6 Claims, 1 Drawing Sheet

(56) References Cited

U.S. PATENT DOCUMENTS

| | | | |
|---|---|---|---|
| 6,709,757 | B2 | 3/2004 | Utz et al. |
| 6,713,559 | B1* | 3/2004 | Ehlig et al. ............... 525/100 |
| 6,896,979 | B2 | 5/2005 | Sawai et al. |
| 2001/0056141 | A1* | 12/2001 | Schutt ...................... 524/261 |
| 2002/0123592 | A1 | 9/2002 | Zhang et al. |
| 2005/0008763 | A1* | 1/2005 | Schachter ................. 427/2.24 |
| 2005/0051763 | A1 | 3/2005 | Affinito et al. |
| 2006/0006541 | A1* | 1/2006 | Tsuchiya et al. ............ 257/759 |
| 2006/0024980 | A1* | 2/2006 | Tsuchiya et al. ............ 438/789 |
| 2006/0093758 | A1* | 5/2006 | Sakakura et al. ............ 428/1.6 |
| 2006/0210929 | A1* | 9/2006 | Yamada ..................... 430/311 |
| 2007/0026168 | A1 | 2/2007 | Kishimoto et al. |
| 2010/0096009 | A1* | 4/2010 | Funayama et al. ........... 136/256 |
| 2010/0120931 | A1* | 5/2010 | Zajaczkowski et al. ...... 521/134 |
| 2010/0139522 | A1* | 6/2010 | Ibach ........................ 106/12 |

FOREIGN PATENT DOCUMENTS

| | | | |
|---|---|---|---|
| JP | 11124543 | | 5/1999 |
| JP | 2000034413 | A | 2/2000 |
| JP | 2002038094 | | 2/2002 |
| JP | 2002337262 | A * | 11/2002 |

OTHER PUBLICATIONS

Machine English Translation of JP_2002/337262, Suzuki, High Gas Barrier Film and Its Manufacturing Method, Nov. 27, 2002, all pages.*

STIC Structure Search Report: STIC; Jan. 8, 2013; whole document.*

Korean Office Action Issued on Feb. 26, 2015 in counter-part application No. KR 10-2008-0071730 filed on Jul. 23, 2000, 4 pages.

* cited by examiner

THIN LAYER HAVING COMPOSITION GRADIENT AND PRODUCTION METHOD THEREOF

This application claims priority to Korean Patent Application No. 10-2008-71730, filed on Jul. 23, 2008, and all the benefits accruing therefrom under U.S.C. §119, the contents of which in its entirety are herein incorporated by reference.

BACKGROUND

1. Field

This disclosure is directed to a thin layer having a composition gradient and a method for the production of the thin layer. More specifically, the thin layer is produced by a sol-gel process and has a composition gradient that enables the control of the surface energy of the thin layer, leaving no interfacial failure defects.

2. Description of the Related Art

With the recent remarkable development of electronic display devices and their related technologies, considerable research has been devoted to the development and application of electronic display devices with various characteristics. In this connection, one approach to impart particular characteristics to electronic display devices is associated with methods for the formation of thin layers. As display devices have been rendered lightweight and small, methods for the formation of thin layers and the characterization of the thin layers are gaining importance. Under these circumstances, research on the kind of characteristics available to impart to thin layers or how to reduce the formation of defects at the interfaces between thin layers and other materials is actively underway.

For example, flexible devices are required to have various characteristics such as non-fragility and flexibility. Organic materials are included in flexible devices to achieve flexibility of the flexible devices. However, typical electronic display devices, such as organic light emitting diodes ("OLEDs") and liquid crystal displays ("LCDs"), include organic materials that are highly sensitive to oxygen or water vapor present in the air, which adversely affects the lifetime of the devices. Flexible devices also need improved characteristics in terms of moisture and gas barrier properties. Many methods have been developed for the protection of electronic display devices using metals and glass to prolong the lifetime of the devices. However, metals are generally disadvantageous in terms of transparency, and glass is not suitable for use in electronic display devices because of its fragility and poor flexibility. Thus, there is a need to develop flexible transparent barrier films or encapsulation thin layers suitable for use in the encapsulation of bendable, thin, and lightweight flexible OLEDs and other electronic devices.

SUMMARY

In one exemplary embodiment, there is provided a thin layer which includes two or more materials selected from one or more organic materials and one or more inorganic materials wherein the thin hybrid layer has a composition gradient in the thickness direction and is produced by a sol-gel process.

In another exemplary embodiment, there is provided a barrier thin layer which comprises an anchoring layer and a barrier layer sequentially formed on a substrate wherein each of the anchoring layer and the barrier layer has a composition gradient in the thickness direction.

In another exemplary embodiment, there is provided a barrier thin layer which may further comprise a protective layer having a composition gradient on the barrier layer. Hydrophobic materials may be distributed on the surface of the protective layer to reduce the surface energy of the barrier thin layer, thereby providing barrier properties against the outside.

In another exemplary embodiment, there is provided a method for producing a thin layer, which comprises subjecting a precursor composition to a sol-gel process to form a thin hybrid layer having a composition gradient in the thickness direction wherein the precursor composition comprises two or more precursors selected from one or more organic precursors and one or more inorganic precursors.

The method may further comprise forming a second layer having a composition gradient on the thin layer. The second layer includes two or more inorganic materials selected from metal oxides, metal nitrides and silicon oxides.

The method may further comprise forming a protective layer having a composition gradient on the second layer by a sol-gel process.

The composition gradient of the layer(s) constituting the thin layer produced by the above methods can be controlled by varying one or more parameters selected from the content of the organic precursors, the kind of functional groups present in the organic precursors, the water content, heating temperature during the sol-gel process, and the kind of a catalyst.

BRIEF DESCRIPTION OF THE DRAWINGS

Exemplary embodiments will be more clearly understood from the following detailed description taken in conjunction with the accompanying drawings, in which.

DETAILED DESCRIPTION

Figure 1:
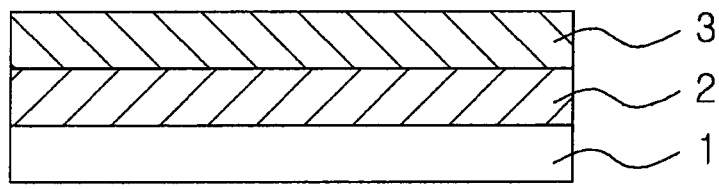
FIG. 1 is a schematic cross-sectional view showing an exemplary embodiment of a barrier thin layer.

A detailed description will be given of exemplary embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one exemplary embodiment, there is provided a thin layer which comprises a first layer including two or more materials selected from one or more organic materials and one or more inorganic materials wherein the first hybrid layer has a composition gradient in the thickness direction and is produced by a sol-gel process.

In another exemplary embodiment, the constituent layer or each of the constituent layers of the thin layer has a composition gradient whose composition changes continuously in the thickness direction (i.e. vertical direction). In this configuration, the surface energy at the interface between the thin layer and another material layer or at the interfaces between the thin layer and a plurality of different material layers is optimized to achieve excellent gas and moisture barrier properties and improved interfacial adhesive strength. Since the thin layer comprises the hybrid layer having a composition gradient so as to have a surface energy similar to that of the adjacent overlying and/or underlying layers, the compositions of the respective layers change continuously in the vertical direction. This continuous composition change prevents the occurrence of a discontinuous layer arising from the formation of an interface to achieve excellent interfacial characteristics and improved interlayer adhesive strength.

In another exemplary embodiment, the thin layer can be produced using a mixture of two or more materials by a sol-gel process so as to have a composition gradient. The sol-gel process allows the materials to migrate during curing to create a composition gradient.

In another exemplary embodiment, the composition gradient of the thin layer may change smoothly with respect to the thickness direction of the layer ("smooth gradient"). Where necessary, the composition gradient of the thin layer may change steeply with respect to the thickness direction of the layer ("stepwise gradient").

In another exemplary embodiment, the first layer may include two or more kinds of materials represented by Formulas 1 and 2:

$$X_a\text{-M-}Y_b \quad (1)$$

wherein X is selected from, methacryloxypropyl, methacryloxymethyl, 3-glycidoxypropyl, $C_1$-$C_{10}$ linear or branched alkyl groups, $C_3$-$C_{10}$ cycloalkyl, phenyl, phenethyl, vinyl, butenyl, 7-octenyl, benzyl, 3-aminopropyl, N-(2-aminoethyl-3-aminoisobutyl), N-(2-aminoethyl-3-aminopropyl), N-(6-aminohexyl-3-aminopropyl), N-(2-aminohexyl-3-aminomethyl), N-(2-aminoethyl-11-aminoundecyl) and aminobutyl, M is selected from Si, Al, Ti, Zr, Zn, P, V, Ge and B, Y is selected from —H, —$CH_3$, —$OCH_3$, —$OC_2H_5$, —$OC_3H_7$, —$OC_4H_9$, —$OC_5H_{11}$ and —Cl, a is an integer from 0 to 3, and b is an integer from 1 to 5;

$$\text{M-}Y_b \quad (2)$$

wherein M is selected from Si, Al, Ti, Zr, Zn, P, V, Ge and B,

Y is selected from —H, —$CH_3$, —$OCH_3$, —$OC_2H_5$, —$OC_3H_7$, —$OC_4H_9$, —$OC_5H_{11}$ and —Cl, and b is an integer from 1 to 5.

In another exemplary embodiment, the thin layer may further comprise a second layer formed on the first layer wherein the second layer includes two or more inorganic materials, has a composition gradient in the thickness direction and has a small difference in surface energy at the interface with the first layer. In other words, the thin layer may have a bilayer structure consisting of first and second layers. Specifically, the inorganic materials are selected from metal oxides, metal nitrides and silicon oxides, and the composition of the second layer changes continuously in the thickness direction.

FIG. 1 is an exemplary schematic cross-sectional view of the thin layer. Referring to FIG. 1, the thin layer comprises a first layer 2 and a second layer 3 formed on a substrate 1 wherein each of the first layer 2 and the second layer 3 has a composition gradient in the thickness direction.

The substrate 1 may be any substrate commonly used in electronic devices. Any substrate that can be utilized in packaging applications may also be used. Suitable materials for the substrate 1 include, but are not limited to, polyoxymethylene, polyvinylnaphthalene, polyetherketone, fluoropolymers, poly(α-methylstyrene), polysulfone, polyphenylene oxide, polyetherimide, polyethersulfone, polyamideimide, polyimide, polyphthalamide, polycarbonate, polyarylate, polyethylene naphthalate, and polyethylene terephthalate.

The use of the first layer 2 having a composition gradient increases the adhesion between the substrate 1 and the second layer 3 composed of inorganic materials to decrease the permeation rates of oxygen, water vapor and other chemical species in air.

In another exemplary embodiment the first layer 2 may include two or more materials selected from one or more organic materials and one or more inorganic materials.

In another exemplary embodiment the first layer 2 has a composition gradient in the vertical direction. Preferably, the composition of the first layer becomes close to that of the bottom of the overlying second layer 3 as it approaches the top of the first layer. This allows for the surface energy of the bottom of the second layer 3 to be similar or identical to that of the top of the first layer 2 to reduce damage and degradation at the interface between the first and second layers. The content of a certain compound included in the first layer 2 may increase with decreasing content of the other compound(s) in the vertical direction. Alternatively, the content of a certain compound included in the first layer 2 may be fixed with increasing or decreasing content of the other compound(s) in the vertical direction.

In another exemplary embodiment, the composition gradient of the first layer 2 may change smoothly with respect to the thickness direction of the layer. The composition gradient of the first layer 2 may change steeply with respect to the thickness direction of the layer.

In another exemplary embodiment, the first layer 2 is formed by a sol-gel process to create a composition gradient. In the sol-gel process, the materials are allowed to migrate during curing to create a composition gradient.

In another exemplary embodiment, the second layer 3 is formed on the first layer 2 and has a composition gradient in the thickness direction. The second layer 3 includes two or more compounds selected from metal oxides, metal nitrides and silicon oxides whose composition changes continuously in the vertical direction. These compounds serve to block the introduction of oxygen, moisture and harmful ingredients from the outside. The metal oxides and nitrides may be those containing metals selected from Group 2A, 3A, 4A, 5A, 6A, 7A, 8A, 1B, 2B, 3B and 4B elements.

In another exemplary embodiment, the content of a certain compound included in the second layer 3 may increase with decreasing content of the other compound(s) in the vertical direction. Alternatively, the content of a certain compound included in the second layer 3 may be fixed with increasing or decreasing content of the other compound(s) in the vertical direction.

In another exemplary embodiment, the composition gradient of the second layer 3 may change smoothly with respect to the thickness direction of the layer, similarly to that of the first layer 2. The composition gradient of the second layer 3 may change steeply with respect to the thickness direction of the layer.

In another exemplary embodiment, the thin layer may be a barrier thin layer capable of blocking the permeation of moisture and oxygen into a plastic substrate or an electronic device. In this case, the first and second layers of the thin layer may be an anchoring layer and a barrier layer of the barrier thin layer, respectively. Each of the anchoring layer and the barrier layer of the barrier thin layer has a composition gradient whose composition changes continuously in the thickness direction (i.e. vertical direction). With this configuration, the surface energy at the interface between the anchoring layer and the barrier layer, which can include different materials, is optimized to achieve excellent gas and moisture barrier properties and improved interfacial adhesive strength. In contrast, a conventional gas barrier film comprises a laminate of an organic layer and an inorganic layer or a plurality of organic layers and inorganic layers in an alternating manner to ensure both barrier properties and flexibility. However, the different compositions and surface characteristics of the organic and inorganic layers give rise to degradation of interfacial characteristics, such as delamination and peeling and changes in composition at the interface.

Figure 2:
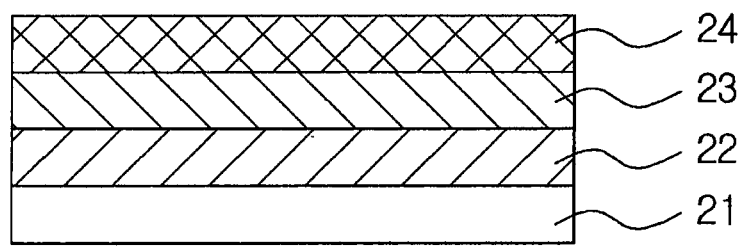
FIG. 2 is a schematic cross-sectional view showing an exemplary embodiment of another barrier thin layer.

In another exemplary embodiment, the thin layer may further comprise a protective layer on the second layer. The protective layer includes two or more materials and has a composition gradient in the thickness direction. Additionally, the protective layer has a hydrophobic surface. FIG. 2 is an exemplary schematic cross-sectional view of the barrier thin layer. Referring to FIG. 2, the barrier thin layer comprises an anchoring layer 22 formed on a substrate 21, a barrier layer 23 formed on the anchoring layer 22, and a protective layer 24 with a composition gradient formed on the barrier layer 23.

The protective layer 24 has improved moisture and gas barrier properties to protect the surface of the barrier layer 23 from damage. In addition, the composition of the bottom of the protective layer 24 is similar to that of the top of the underlying barrier layer 23. This composition similarity reduces the difference in surface energy between the protective layer 24 and the barrier layer 23 to prevent degradation in interfacial characteristics. In another exemplary embodiment, hydrophobic materials are distributed on the outermost surface of the protective layer 24. In another exemplary embodiment, the protective layer 24 has a minimum surface energy converging to zero for polarity, which is a factor determining the surface energy of the layer.

In another exemplary embodiment, the protective layer 24 is formed by a sol-gel process which creates a composition gradient. In the sol-gel process, the materials are allowed to migrate during curing to create a composition gradient.

In another exemplary embodiment, the composition gradient of the protective layer 24 may change smoothly with respect to the thickness direction of the layer, in a manner similar to that of the anchoring layer 22. The composition gradient of the protective layer 24 may change steeply with respect to the thickness direction of the layer.

In another exemplary embodiment, the protective layer 24 may include a compound containing fluorine, silicone, or a hydrophobic organic material. Specifically, the protective layer 24 may include a material represented by Formula 3 or 4:

$$Z_a\text{-M-}Y_b \quad (3)$$

wherein Z is selected from methyl, ethyl, n-propyl, n-butyl, isobutyl, hexyl, hexadecyl, n-heptyl, n-octyl, n-octadecyl, dodecyl, decyl, pentyl, docosyl, bis(trimethylsilylmethyl), 3,3,3-trifluoropropyl, tridecafluoro-1,1,2,2-tetrahydrooctyl, fluoroalkyl groups, fluoroalkoxy groups, pentafluorophenyl, heptadecafluoro-1,1,2,2-tetrahydrodecyl, 3-heptafluoroisopropoxypropyl, trifluoromethyl, nonafluorohexyl, pentafluorophenylpropyl, perfluorodecyl, perfluorotetradecyl, 3-trifluoromethyltetrafluorophenyl and trifluoromethyl, M is selected from Si, Al, Ti, Zr, Zn, P, V, Ge and B, Y is selected from —H, —CH$_3$, —OCH$_3$, —OC$_2$H$_5$, —OC$_3$H$_7$, —OC$_4$H$_9$, —OC$_5$H$_{11}$ and —Cl, a is an integer from 0 to 3, and b is an integer from 1 to 5;

$$\text{M-}Y_b \quad (4)$$

wherein M is selected from Si, Al, Ti, Zr, Zn, P, V, Ge and B,

Y is selected from —H, —CH$_3$, —OCH$_3$, —OC$_2$H$_5$, —OC$_3$H$_7$, —OC$_4$H$_9$, —OC$_5$H$_{11}$ and —Cl, and b is an integer from 1 to 5.

In another exemplary embodiment, the thin layer may comprise pairs of first and second layers. The thin layer may be a multilayer structure in which the first and second layers are formed in an alternating manner. For example, the multilayer-structured thin layer may comprise a first pair of the anchoring layer and the barrier layer and a second pair of the anchoring layer and the barrier layer overlying the first pair. In another exemplary embodiment, the multilayer-structured thin layer may further comprise a protective layer on the outermost surface thereof.

In an exemplary embodiment, there is provided a method for producing a thin layer, which comprises subjecting a precursor composition to a sol-gel process to form a thin layer having a composition gradient in the thickness direction wherein the precursor composition comprises two or more precursors selected from one or more organic precursors and one or more inorganic precursors.

In another exemplary embodiment, a thin layer which comprises a graded composition layer can be produced by a sol-gel process. The sol-gel process is a wet-type process. For example, hydrolysis, water condensation and alcohol condensation reactions are allowed to proceed using a solution of tetraethylorthosilicate ("TEOS") in the presence of an acid or base catalyst to convert the solution to a gel state, which is then converted to a solid phase. Taking advantage of the reactions, the solution can be uniformly dispersed on the surface of a wafer or a complex structure formed on a wafer using a rotary agitator to form an anchoring layer having a thickness of about 0.1 micrometer to about 100 micrometers. After completion of the final condensation, it is necessary to perform sintering at about 60° C. to about 150° C. This series of processing steps allow two or more materials to migrate to create a composition gradient.

In another exemplary embodiment, the composition used for the sol-gel process may comprise: two or more precursors selected from the group consisting of organic precursors and inorganic precursors; an organic solvent; and water. In another exemplary embodiment, the precursors may include at least one material selected from silica ($SiO_2$), alumina ($Al_2O_3$) and a material represented by Formula 1:

$$X_a\text{-M-}Y_b \quad (1)$$

wherein X is selected from methacryloxypropyl, methacryloxymethyl, 3-glycidoxypropyl, $C_1$-$C_{10}$ linear or branched alkyl groups, $C_3$-$C_{10}$ cycloalkyl, phenyl, phenethyl, vinyl, butenyl, 7-octenyl, benzyl, 3-aminopropyl, N-(2-aminoethyl-3-aminoisobutyl), N-(2-aminoethyl-3-aminopropyl), N-(6-aminohexyl-3-aminopropyl), N-(2-aminohexyl-3-aminomethyl), N-(2-aminoethyl-11-aminoundecyl) and aminobutyl, M is selected from Si, Al, Ti, Zr, Zn, P, V, Ge and B, Y is selected from —H, —$CH_3$, —$OCH_3$, —$OC_2H_5$, —$OC_3H_7$, —$OC_4H_9$, —$OC_5H_{11}$ and —Cl, a is an integer from 0 to 3, and b is an integer from 1 to 5.

Examples of the precursors include, but are not limited to, tetraethylorthosilicate ("TEOS"), 3-glycidyloxypropyltrimethoxysilane ("GLYMO"), γ-aminopropyltriethoxysilane ("γ-APS"), dimethyldimethoxysilane (DMDS) and dimethyldiethoxysilane.

In another exemplary embodiment, the composition gradient of the thin layer can be controlled by varying one or more parameters selected from the content of the precursors, the kind of functional groups of the precursors, the water content, heating temperature during the sol-gel process, and the kind of the catalyst.

In the sol-gel process, self-migration of the materials is induced during curing to create a composition gradient. At this time, the formation rate of the thin layer varies depending on various conditions. Generally, a steep composition gradient of the thin layer is created ("stepwise gradient") at a high rate and a smooth composition gradient of the thin layer is created ("smooth gradient") at a low rate. Heating temperature is a general factor determining the reaction rates.

In another exemplary embodiment, the composition gradient of the thin layer can be controlled by varying the amount of the water added to the composition. Specifically, the thin layer has a smooth gradient when the precursors participating in the reactions and the water are added in the stoichiometric ratio, and the thin layer has a stepwise gradient when the water is added in an amount smaller than the stoichiometric ratio. For reference, one water molecule can be used to hydrate one methoxy or ethoxy group of the precursors.

In another exemplary embodiment, the catalyst added to the composition for the sol-gel process is an acid catalyst ($H^+$). An example of an acid catalyst is, but not limited to, HCl. The catalyst can accelerate or retard the reactions to control the gradient of the thin layer.

In another exemplary embodiment, the reaction rates can be controlled by varying the content of the organic precursors added to the composition. A difference in the hydrophobicity or hydrophilicity of the functional groups of the organic precursors varies the degree of separation of the materials to control the gradient. More specifically, highly hydrophobic and hydrophilic materials create a steeper gradient than a mixture of two materials with a small difference in surface energy.

In another exemplary embodiment, the composition may further comprise an organic precursor having one or more highly reactive functional group. Examples of functional groups present in the organic precursor include, but are not limited to, an amine (—$NH_2$), glycidyl (—$OC_2H_3$), methacryloxy (—$OCOC_3H_5$) and hydroxyl (—OH) groups.

In another exemplary embodiment a stepwise gradient can be created by the use of water in a smaller amount than the stoichiometric ratio (i.e. a relatively large amount of the organic precursor), the use of a reduced amount of the catalyst, or performing curing for a shorter time.

Suitable processes for applying the composition to a substrate include drop casting, spin coating, dip coating, spray coating, flow coating and screen printing, but are not limited thereto.

The method may further comprise forming a second layer on the first layer wherein the second layer includes two or more inorganic materials and has a composition gradient. The second layer can be formed by physical vapor deposition ("PVD") using a multi-target.

The method may further comprise forming a protective layer having a composition gradient on the second layer by a sol-gel process.

In an exemplary embodiment, there is provided a composition for the formation of the protective layer which comprises: two or more precursors selected from hydrophobic organic precursors and organic/inorganic hybrid precursors; an organic solvent; water; and optionally, an inorganic precursor. The hydrophobic organic precursors may include a material represented by Formula 3:

$$Z_a\text{-M-}Y_b \quad (3)$$

wherein Z is selected from methyl, ethyl, n-propyl, n-butyl, isobutyl, hexyl, hexadecyl, n-heptyl, n-octyl, n-octadecyl, dodecyl, decyl, pentyl, docosyl, bis(trimethylsilylmethyl), 3,3,3-trifluoropropyl, tridecafluoro-1,1,2,2-tetrahydrooctyl, fluoroalkyl groups, fluoroalkoxy groups, pentafluorophenyl, heptadecafluoro-1,1,2,2-tetrahydrodecyl, 3-heptafluoroisopropoxypropyl, trifluoromethyl, nonafluorohexyl, pentafluorophenylpropyl, perfluorodecyl, perfluorotetradecyl, 3-trifluoromethyltetrafluorophenyl and trifluoromethyl, M is selected from Si, Al, Ti, Zr, Zn, P, V, Ge and B, Y is selected from —H, —$CH_3$, —$OCH_3$, —$OC_2H_5$, —$OC_3H_7$, —$OC_4H_9$, —$OC_5H_{11}$ and —Cl, a is an integer from 0 to 3, and b is an integer from 1 to 5.

Examples of the hydrophobic organic precursors include, but are not limited to, (tridecafluoro-1,1,2,2,-tetrahydrooctyl)trimethoxysilane and dimethyldimethoxysilane.

The protective layer has improved moisture and gas barrier properties to protect the surface of the underlying layer from damage. In another exemplary embodiment, the hydrophobic materials are distributed on the surface of the protective layer. In another exemplary embodiment, the protective layer has a minimum surface energy converging to zero for polarity, which is a factor determining the surface energy of the layer.

In another exemplary embodiment, the composition gradient of the protective layer can be controlled by varying one or more parameters selected from the content of the precursors, the kind of functional groups of the precursors, the water content, heating temperature during the sol-gel process and the kind of a catalyst.

In another exemplary embodiment, the method can be applied to the production of a barrier thin layer. A typical barrier thin layer comprises a barrier layer formed on a substrate. To improve the adhesive strength between the barrier layer and the substrate, an anchoring layer can be interpose between the barrier layer and the substrate. In another exemplary embodiment, the barrier layer includes inorganic materials and the anchoring layer is composed of organic materials or inorganic materials.

In another exemplary embodiment, the barrier layer is formed by depositing two or more compounds selected from metal oxides, metal nitrides and silicon oxides on the anchoring layer in a PVD system. In the barrier layer, the composition of the two or more compounds is continuously inclined in the vertical direction.

Suitable PVD processes for the deposition of the barrier layer include, but are not limited to, sputtering, pulsed laser deposition ("PLD"), ion beam deposition ("IBD") and ion beam assisted deposition ("IBAD").

The PVD process can also be carried out by co-deposition using a multi-target. Examples of such co-deposition processes include, but are not limited to, co-sputtering, co-pulsed laser deposition ("co-PLD"), co-ion beam deposition ("co-IBD") and co-ion beam assisted deposition ("co-IBAD").

When it is intended to form the barrier layer by co-sputtering, different RF power levels are supplied to two or more compound targets. The RF power levels are varied at constant power and time intervals such that the composition gradient of the compounds in the barrier layer can be continuously inclined in the vertical direction.

The RF power levels are varied in an instantaneous and automatic manner to form the graded composition layer without any interfaces. As a result, a graded composition encapsulation thin layer with a transmittance as high as about 85% in the visible region can be produced.

The RF power levels can be regulated such that the content of a certain compound in the composition increases with decreasing content of the other compound(s). Alternatively, the content of a certain compound in the composition may be fixed with varying (increasing or decreasing) content of the other compound(s).

In another exemplary embodiment, the method may further comprise sequentially repeating the steps of forming the thin layer and the second layer twice or more to form a multilayer structure consisting of pairs of the layers.

In another exemplary embodiment, an anchoring layer and a barrier layer are formed, each of which has a composition gradient so as to have a surface energy which is similar to that of the adjacent overlying and/or underlying layers. In this configuration, the surface energy at the interfaces is minimized (i.e. optimized) to achieve improved interfacial adhesive strength. A protective layer having a composition gradient is also formed on the outermost barrier thin layer by a sol-gel process. The protective layer has a hydrophobic surface to minimize contact with moisture in air, resulting in an improvement in the quality of the thin layer. In another exemplary embodiment, the barrier layer is deposited by a dry deposition process and other layers are formed by a wet process, with the surface energy of the layers controlled to produce a barrier thin layer without degradation of interfacial characteristics.

The barrier thin layer has high interlayer adhesive strength and the ability to inhibit permeation of gases and moisture, and is highly resistant to diffusion of other chemical species. Therefore, the barrier thin layer is useful in blocking moisture and gases in flexible substrates. The use of the barrier thin layer for the encapsulation of electronic devices is effective in prolonging the lifetime of the electronic devices. The barrier thin layer can therefore be used as a potential replacement for glass. Examples of such electronic devices include but are not limited to organic light-emitting devices, display devices, photovoltaic devices, integrated circuits, pressure sensors, chemosensors, biosensors, solar-powered devices and sensors for lighting.

A better understanding of exemplary embodiments will be described in more detail with reference to the following examples. However, these examples are given merely for the purpose of illustration and are not to be construed as limiting the scope of the embodiments.

EXAMPLES

Example 1

Tetraethylorthosilicate ("TEOS"), 3-glycidyloxypropyltrimethoxysilane ("GLYMO"), γ-aminopropyltriethoxysilane ("γ-APS") and dimethyldimethoxysilane ("DMDS") were mixed in a molar ratio of about 2:2:1:1 in ethanol to prepare a solution. To the solution was added water in an equimolar amount relative to hydroxyl (—OH) groups present in the solution. The mixed solution was applied to an about 100 μm-thick plastic substrate by spin coating with about 2000 rpm, at an acceleration rate of about 500 rpm/s for about 20 seconds. Subsequently, the coated substrate was heated in a vacuum oven at about 80° C. for about 2 hours to form an anchoring layer.

$Al_2O_3$—$SiO_2$ was deposited on the anchoring layer using a deposition system (Sputter Infovion No. 3, manufactured by Infovion, 2 gun co-sputtering, 6 inch substrate) to produce an about 50 nm-thick barrier layer. Specifically, the $Al_2O_3$—$SiO_2$ barrier layer was formed by increasing RF power applied to an $Al_2O_3$ target from about 100 W to about 600 W at constant intervals to gradually increase the $Al_2O_3$ concentration while decreasing RF power applied to a $SiO_2$ target from about 600 W to about 100 W at constant intervals to gradually decrease the $SiO_2$ concentration.

Example 2

Tetraethylorthosilicate ("TEOS") and (tridecafluoro-1,1,2,2-tetrahydrooctyl)trimethoxysilane were mixed in a molar ratio of 1:0.1 in ethanol to prepare a solution. To the solution was added water in an equimolar amount relative to hydroxyl (—OH) groups present in the solution. The mixed solution was applied to the thin layer produced in Example 1 by spin coating with about 2000 rpm, at an acceleration rate of about 500 rpm/s for about 20 seconds. Subsequently, the coated structure was heated in a vacuum oven at about 80° C. for about 2 hours to form a hydrophobic protective layer.

Example 3

A thin layer was produced in the same manner as in Example 2 except that water was added in an amount of about 0.5 equivalents relative to hydroxyl (—OH) groups present in the solution.

Experimental Example 1

Analysis of Compositions as a Function of Depth

Figure 3:
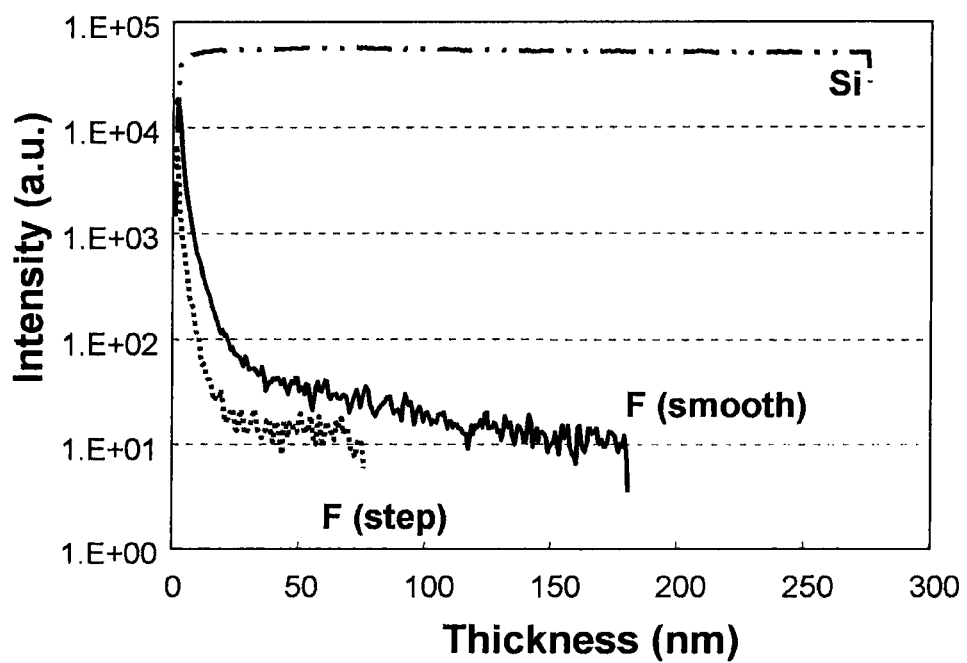
FIG. 3 is a graph showing the composition distribution profiles of thin layers formed in Examples 2 and 3 along the vertical direction.

The composition distribution profiles of the anchoring layers and the barrier layers of the thin layers produced in Examples 2 and 3 along the vertical direction were analyzed using a time of flight secondary ion mass spectrometer ("TOF-SIMS"), which is a surface-sensitive spectroscopy technique. FIG. 3 shows the distribution profiles of $SiO_2$ and F in the thin layers.

The graph shows that the thin layer produced using a relatively high water content in Example 2 had a smooth gradient and the thin layer produced using a relatively low water content in Example 3 had a steep gradient.

These results show that each of the anchoring layers and the protective layers of the thin layers produced in Examples 1, 2 and 3 had a composition gradient.

Although the invention has been described in detail with reference to the exemplary embodiments, the embodiments are simply for the purpose of illustration. It will be understood by those skilled in the art that various modifications and their equivalents can be made in example embodiments.

What is claimed is:

1. A thin layer comprising a first layer including two or more materials selected from the group consisting of one or more organic materials and one or more inorganic materials wherein the thin layer has a composition gradient in the thickness direction and is produced by a sol-gel process, wherein the first layer includes tetraethylorthosilicate ("TEOS"), 3-glycidyloxypropyltrimethoxysilane ("GLYMO"), γ-aminopropyltriethoxysilane "γ-APS") and dimethyldimethoxysilane ("DMDS") in a molar ratio of about 2:2:1:1; further comprising a second layer formed on the first layer wherein the second layer includes two or more inorganic materials, having a composition gradient in the thickness direction, and has a small difference in surface energy at the interface with the first layer, wherein the two or more inorganic materials of the second layer are selected from the group consisting of metal oxides, metal nitrides and silicon oxides, and the composition of the second layer changes continuously in the thickness direction.

2. The thin layer of claim 1, wherein the thin layer has a stepwise or smooth composition gradient with respect to the thickness direction of the layer.

3. The thin layer of claim 1, further comprising a protective layer formed on a second layer wherein the protective layer includes two or more materials, has a composition gradient in the thickness direction, and has a hydrophobic surface.

4. The thin layer of claim 3, wherein the protective layer includes a material selected from the group consisting of:

$$Z_a\text{-M-}Y_b$$

wherein Z is selected from the group consisting of methyl, ethyl, n-propyl, n-butyl, isobutyl, hexyl, hexadecyl, n-heptyl, n-octyl, n-octadecyl, dodecyl, decyl, pentyl, docosyl, bis(trimethylsilylmethyl), 3,3,3-trifluoropropyl, tridecafluoro-1,1,2,2-tetrahydrooctyl, fluoroalkyl groups, fluoroalkoxy groups, pentafluorophenyl, heptadecafluoro-1,1,2,2-tetrahydrodecyl, 3-heptafluoroisopropoxypropyl, trifluoromethyl, nonafluorohexyl, pentafluorophenylpropyl, perfluorodecyl, perfluorotetradecyl, 3-trifluoromethyltetrafluorophenyl and trifluoromethyl, M is selected from the group consisting of Si, Al, Ti, Zr, Zn, P, V, Ge and B, Y is selected from the group consisting of —H, —CH$_3$, —OCH$_3$, —OC$_2$H$_5$, —OC$_3$H$_7$, —OC$_4$H$_9$, —OC$_5$H$_{11}$ and —Cl, a is an integer from 0 to 3, and b is an integer from 1 to 5; and $$\text{M-}Y_b$$

wherein M is selected from the group consisting of Si, Al, Ti, Zr, Zn, P, V, Ge and B, Y is selected from the group consisting of —H, —CH$_3$, —OCH$_3$, —OC$_2$H$_5$, —OC$_3$H$_7$, —OC$_4$H$_9$, —OC$_5$H$_{11}$ and —Cl, and b is an integer from 1 to 5.

5. The thin layer of claim 1, wherein the thin layer comprises at least first and second layers in an alternating manner to form a multilayer structure.

6. The thin layer of claim 5, wherein the first and second Layers of the thin layer are an anchoring layer and a barrier layer, respectively, and the thin layer is a barrier thin layer.

* * * * *